United States Patent [19]

Muterspaugh

[11] Patent Number: 4,850,039
[45] Date of Patent: Jul. 18, 1989

[54] TRANSISTOR MIXER

[75] Inventor: Max W. Muterspaugh, Indianapolis, Ind.

[73] Assignee: RCA Licensing Corporation, Princeton, N.J.

[21] Appl. No.: 879,936

[22] Filed: Jun. 30, 1986

[51] Int. Cl.$^4$ .............................................. H04B 1/28
[52] U.S. Cl. ..................................... 455/333; 455/253; 334/15
[58] Field of Search ............... 455/253, 333, 150, 325, 455/179, 183, 313; 334/15; 358/191.1

[56] References Cited

U.S. PATENT DOCUMENTS

| | | |
|---|---|---|
| 3,348,154 | 10/1967 | Fish, Jr. et al. ..................... 455/333 |
| 3,348,155 | 10/1967 | Von Recklinghausen ......... 455/333 |
| 3,694,756 | 9/1972 | Carlson . |
| 3,976,944 | 8/1976 | Kreng et al. ......................... 455/313 |
| 4,160,953 | 7/1979 | Matsuura et al. ................... 455/333 |
| 4,162,451 | 7/1979 | Ash ..................................... 455/333 |
| 4,556,990 | 12/1985 | Hasler ................................. 455/253 |
| 4,633,188 | 12/1986 | Matsuta ............................... 455/333 |

FOREIGN PATENT DOCUMENTS

| | | | |
|---|---|---|---|
| 4364771 | 12/1971 | Japan | ................................... 455/333 |
| 0024427 | 2/1977 | Japan | ................................... 455/333 |
| 0251702 | 1/1988 | Japan | ................................... 455/333 |

OTHER PUBLICATIONS

"The Channel 6 Color Beat—What Can Be Done About It?", by Hector L. Gasquet, IEEE Transactions on Broadcast and Television Receivers, Feb. 1972, BTR-18, No. 1, pp. 11-17.

"Television Engineering Handbook", K. Blair Benson, McGraw-Hill Book Company, New York; 1986, pp. 13.92-13.93.

Primary Examiner—Robert L. Griffin
Assistant Examiner—Curtis A. Kuntz
Attorney, Agent, or Firm—E. M. Whitacre; P. M. Emanuel; T. F. Lenihan

[57] ABSTRACT

A mixer for mixing first and second signals for providing a difference signal comprises a mixing transistor. The first and second signals are applied between the base and emitter electrodes of the transistor. A non-linear impedance is coupled in series with the emitter electrode. Spurious signal components are reduced in amplitude compared with the difference signal.

7 Claims, 1 Drawing Sheet

TRANSISTOR MIXER

The present invention relates to transistor mixers, particularly such as may be used in a tuner in a television (TV) receiver.

Standard broadcast TV transmissions in the United States and in many other countries have been assigned to use standard carrier frequencies corresponding to respective TV broadcast channels. Practically all TV receivers nowadays are superheterodynes using a mixer to produce an intermediate frequency (IF) signal which has been effectively standardized in the United States at 45.75 MHz for the IF picture carrier and 41.25 MHz for the sound carrier. In practice, the local oscillator which provides a signal for heterodyning or mixing with a received radio frequency (RF) signal so as to provide the IF signals is nearly always operated at a frequency above that of the RF signal. Consequently, the respective local oscillator frequencies for correct tuning of the various channels are effectively standardized since the oscillator frequency is then higher than the standard RF frequency being received by an amount equal to the effectively standardized IF frequency.

In a superheterodyne receiver, interference may be caused by spurious IF signals resulting from heterodyne beats in the receiver mixer between a harmonic of an RF input signal and the local oscillator signal or from a spurious mixing of RF signals. See e.g. "Television Engineering Handbook," K. Blair Benson, McGraw-Hill Book Company, New York; 1986, pp. 13.92–13.93. As a result of the particular TV standard broadcast frequency allocations in the United States, one particularly troublesome form of interference is known to occur on TV Channel 6. When a TV receiver is correctly tuned to Channel 6, the local oscillator (LO) signal is at 129.0 MHz, i.e. 45.75 MHz above the picture carrier (PC) frequency of 83.25 MHz for Channel 6. The sound carrier (SC) for Channel 6 is at 87.75 MHz, (resulting in a second harmonic component at 175.5 MHz). The color subcarrier for Channel 6 is at 86.83 MHz. Accordingly, the following frequency combinations take place in the mixer:

(A) 129.0 MHz − 83.25 MHz = 45.75 MHz
(B) 129.0 MHz − 86.83 MHz = 42.17 MHz
(C) 129.0 MHz − 87.75 MHz = 41.25 MHz
(D) (83.25 MHz + 87.75 MHz) − 129.0 MHz = 42.0 MHz
(E) (2 × 87.75) MHz − 129.0 MHz = 46.5 MHz (A), (B) and (C) are the IF picture carrier, the color subcarrier, and the sound carrier respectively. (D) and (E) are undesired interfering components which fall within the IF passband. Component (D) interferes with the color subcarrier to produce a colored pattern on the RV picture screen. Component (E) interferes with the picture carrier to produce a luminance beat.

The level of interfering components is lower when a "square law" type of device is utilized for the mixer. E.g. see "*The Channel 6 Color Beat—What can be done about it?*", Hector L. Gasquet, IEEE Transactions on Broadcast and Television Receivers; Feb. 1972, BTR-18, No. 1, pp. 11–17. With such a device, the RF signal is multiplied by the local oscillator signal, producing substantially only the desired IF carriers within the IF passband. However, the local oscillator signal amplitude must be kept considerably larger than the RF signal amplitude to reduce interfering components which result from multiplication between carrier signals. A dual gate MOSFET can provide good performance as a mixer with regard to interfering components. However, it requires individual bias adjustment to achieve it and is therefore costly in production. Single- and double-balanced diode mixers can also provide good performance but their cost is relatively high and their physical size is larger. Small size is an important consideration in tuners for modern TV receivers. A bipolar transistor is relatively inexpensive, but provides only marginally poor performance as a mixer in a TV tuner, with regard to the type of interference discussed above.

In accordance with one aspect of the invention, a mixer for mixing first and second signals for providing an output including a frequency difference signal comprises a mixing transistor having emitter, base and collector electrodes. The first and second signals are applied between the base and emitter electrodes. A non-linear impedance arrangement is coupled between the emitter electrode and a point of reference potential.

In accordance with a second aspect of the invention, the non-linear impedance arrangement includes a diode.

In accordance with a third aspect of the invention, the diode is biased so as to reduce the amplitude of spurious signal components present in the output signal relative to the amplitude of the frequency difference signal.

In accordance with a fourth aspect of the invention, a mixer in a tuner is coupled to a local oscillator for heterodyning radio frequency signals to an intermediate frequency. The mixer includes a transistor arrangement having emitter, base and collector electrodes. The base electrode is coupled to the tuner input and to the local oscillator. The collector electrode is coupled to the tuner output. A non-linear impedance arrangement is coupled between the emitter electrode and a point of reference potential.

In accordance with a fifth aspect of the invention, the non-linear impedance arrangement comprises a diode arrangement.

In accordance with a sixth aspect of the invention, the diode arrangement comprises a diode.

In accordance with a seventh aspect of the invention, a bias arrangement is coupled to the diode.

Figure 1:
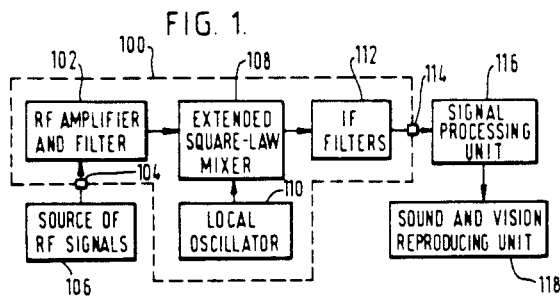
FIG. 1 shows in block diagram form a television receiver, in accordance with the present invention.

In the television (TV) receiver of FIG. 1, a tuner 100 includes a radio frequency amplifier and filter 102 for processing a signal supplied to a tuner input terminal 104 from a source of RF signals 106. The Rf output of RF amplifier and filter 102 is supplied to an extended square law mixer 108 which provides an intermediate frequency (IF) signal by heterodyning the output of RF amplifier 102 and a local oscillator signal provided by a local oscillator 110. The operation of extended square law mixer 108 will later be described in detail. The IF signal is filtered by an IF filter 112 and is supplied by way of a tuner output terminal 114 to a signal processing unit 116. Signal processing unit 116 further processes the IF signal in a convential manner, including sound, vision and sync separation, for driving a conventional TV sound and vision reproducing unit 118 which also includes the usual deflection apparatus.

Figure 2:
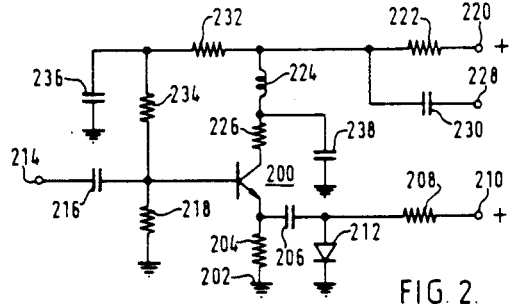
FIG. 2 shows in circuit schematic form a mixer arrangement in accordance with the invention.

FIG. 2 shows an extended square law mixer in accordance with the present invention, suitable for mixer 100 in the TV receiver of FIG. 1. An NPN transistor 200 has its emitter coupled to a ground 202 by way of a resistor 204. The emitter is also coupled by way of a series connection of a capacitor 206 and a resistor 208 to a bias input terminal 210. The junction of capacitor 206 and resistor 208 is coupled to ground by way of a diode 212. Transistor 200 has its base coupled to an input terminal 214 by way of a coupling capacitor 216 and is coupled to ground by way of a resistor 218. A supply terminal 220 for receiving a supply of positive operating voltage relative to ground is coupled to the collector of transistor 200 by way of a series connection of a resistor 222, an inductor 224, and a resistor 226. The junction of resistor 222 and inductor 224 is coupled to a mixer output terminal 228 by way of a coupling capacitor 230 and is also coupled to the base of transistor 200 by way of a series connection of two resistors, 232 and 234. The junction of resistors 232 and 234 is coupled to ground by way of a capacitor 236. The junction of inductor 224 and resistor 226 is coupled to ground by way of a capacitor 238.

In operation, the positive operating voltage on supply terminal 220 sets up a positive voltage at the base of transisotr 200, by way of the voltage divider string comprising resistors 222, 232, 234, and 218. The voltage drop thereby established across resistor 204 causes emitter and collector current to flow in transistor 200. The DC collector current causes only a negligibly small voltage drop across inductor 224 which has a low DC resistance and across resistor 226 which has a very low value, (e.g. 10 ohms) and is included as a "stopper" for preventing parasitic high frequency oscillations. (A ferrite "bead" can also be used for this purpose.) The coupling of resistors 232 and 234 provides DC negative feedback so as to stabilize the collector current of transistor 200 at a predetermined value. Capacitor 236 provides a low impedance bypass to ground which makes the feedback inoperative for AC. A positive bias voltage is applied to bias input terminal 210 so as to provide forward bias current to diode 212, by way of resistor 208. Capacitor 206 exhibits a low impedance over the operating frequency range, so that the non-linear forward biased impedance of diode 212 appears in shunt with resistor 204. The impedance of diode 212 is adjustable by changing the bias voltage on bias input terminal 210. RF and local oscillator signals are applied to input terminal 214, for example, from RF amplifier and filter 102 and local oscillator 110. Mixing takes place in transistor 200 due to its non-linear transfer characteristic. The resulting (IF) difference signal is selected by the tuned circuit comprising inductor 224 and capacitor 238 and is supplied to output terminal 228 by way of capacitor 230.

Figure 3:
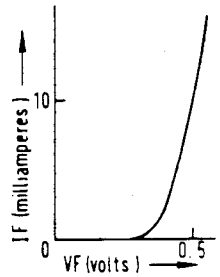
FIG. 3 shows a graph of a diode characteristic curve useful in facilitating an understanding of the invention.

As was explained, undesired interfering components occur in the IF output, such as the color and luminance beats which occur on Channel 6. In a prior art transistor mixer without diode 212, such beats are produced at undesirably high levels. The present inventor has found that a considerable reduction in interfering components (e.g. 13 dB) is obtained when diode 212 a schottkey diode is of a type having a forward conduction characteristic, such that the combined characteristic of transistor 200 and diode 212 exhibits a square law type characteristic which is extended beyond that available using the intrinsic characteristic of transistor 200 without diode 212. Diode 212 advantageously exhibits a characteristic wherein the forward current (IF) is approximately proportional to the square of the foward voltage (VF). The characteristic of a suitable schottkey diode is shown in FIG. 3.

Further advantage in reducing interfering components is obtained by biasing diode 212 at a bias point approximately in the center of the region in which it exhibits square law behavior. Since capacitor 206 blocks DC, the DC current in diode 212 can be adjusted independently of the DC current in transistor 200, while for AC signals, the impedance of diode 212 still appears between the emitter of transistor 200 and ground. A slight reduction in gain is caused by the impedance of diode 212, and in practice, a compromise bias point may be selected at which a satisfactory amount of reduction of interfering components is achieved with only a small reduction in gain. That is, the amplitude of undesired, spurious components is reduced as compared with the desired IF difference signal.

Figure 4:
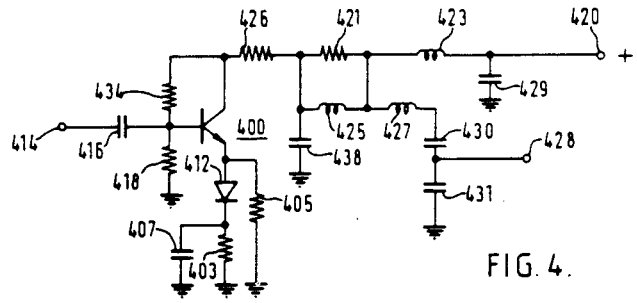
FIG. 4 shows in circuit schematic form a mixer arrangement in accordance with the invention.

FIG. 4 shows another embodiment of the present invention. Corresponding parts in FIGS. 2 and 4 are designated by reference numerals having the same last two digits. Diode 412 is provided bias by a self-biased arrangement which does not need a separate bias source. A portion of the DC emitter current of transistor 400 is bypassed from diode 412 by a resistor 405. A resistor 403 determines the current in diode 412 and is bypassed by a capacitor 407 over the operating frequency range, so that the impedance of diode 412 appears effectively between the emitter of transistor 400 and ground. The IF output is coupled to an output terminal 428 by a coupling network comprising inductors 423, 425, and 427 and capacitors 430, 431, and 438.

The following component specifications were found satisfactory in the circuit of FIG. 4:

| | |
|---|---|
| Transistor 400 | NEC Type 2SC2759 |
| Diode 412 | RCA Type 1471922-1 or NEC Type 1SS97 |
| Resistor 403 | 330 ohms |
| Resistor 405 | 560 ohms |
| Resistor 418 | 2200 ohms |
| Resistor 426 | 22 ohms |
| Resistor 427 | 2700 ohms |
| Resistor 434 | 4700 ohms |
| Capacitor 407 | 0.01 microfarad |
| Capacitor 416 | 2200 picofarad |
| Capacitor 429 | 0.01 microfarad |
| Capacitor 430 | 15 picofarad |
| Capacitor 431 | 82 picofarad |
| Capacitor 438 | 15 picofarad |
| Inductor 423 | 70 millihenry |
| Inductor 425 | 0.65-1.1 microhenry |
| Inductor 427 | 0.65-1.1 microhenry |

It will be understood that various modifications may be made in the described embodiments. For example, transformer coupling may be used for the IF output coupling network. Such modifications are within the scope of the invention, which is defined by the following claims.

What is claimed is:

1. A mixer for mixing first and second signals for providing a difference signal thereof, said mixer comprising:

a bipolar mixing transistor having emitter, base, and collector electrodes; and diode means for exhibiting a square law characteristic coupled between said emitter electrode and a point of reference potential and forward biased;

said first and second signals being applied between said base electrode and said point of reference potential;

wherein said transistor means exhibits an intrinsic transfer characteristic approximating a square law transfer characteristic and the combination of said transistor an said diode causes said mixer to exhibit an effective transfer characteristic approximating a square law transfer characteristic over a greater range of operating current than that exhibited by said transistor without said diode.

2. A tuner having an input for a radio frequency (RF) signal and an output for an intermediate frequency (IF) signal, said tuner including a local oscillator and a mixer coupled to said local oscillator for heterodyning said RF signal to said intermediate frequency, wherein said mixer comprises:

a point of reference potential;

bipolar transistor means having emitter, base and collector electrodes, said base being coupled to each of said input and said local oscillator and said collector being coupled to said output; and diode means for exhibiting a square law characteristic coupled between said emitter electrode and said point of reference potential and forward biased;

wherein said transistor means exhibits an intrinsic transfer characteristic and approximating a square law transfer characteristic the combination of said transistor and said diode causes said mixer to exhibit an effective transfer characteristic approximating a square law transfer characteristic over a greater range of operating current than that exhibited by said transistor without said diode.

3. A tuner as recited in claim 2 wherein a current flows through said emitter electrode and a portion of said current less than the whole flows through said diode.

4. A tuner as recited in claim 2 wherein the magnitude of a direct current flowing through said diode is controllable independently of the magnitude of a direct current flowing through said emitter electrode.

5. In a television (TV) receiver, a mixer for mixing a TV radio frequency signal and a local oscillator (LO) signal for providing as an intermediate frequency (IF) output signal, a difference signal of said RF and LO signals, said mixer comprising:

a bipolar mixer transistor having emitter, base, and collector electrodes; and schottkey diode means for exhibiting a square law characteristic coupled between said emitter electrode and said point of reference potential and forward biased;

said RF and LO signals being applied between said base electrode and said point of reference potential;

wherein said transistor means exhibits an intrinsic transfer characteristic approximating a square law transfer characteristic and the combination of said transistor and said diode causes said mixer to exhibit an effective transfer characteristic approximating a square law transfer characteristic over a greater range of operating current than that exhibited by said transistor without said diode.

6. In a television (TV) receiver, a mixer for mixing a TV radio frequency signal and a local oscillator (LO) signal for providing as an intermediate frequency (IF) output signal; a difference signal of said RF and LO signals, said mixer comprising:

a bipolar mixer transistor having emitter, base, and collector electrodes; and schottkey diode means for exhibiting a square law characteristic coupled between said emitter electrode and said point of reference potential; bias means coupled to said diode for providing forward bias current thereto;

said RF and LO signals being applied between said base electrode and said point of reference potential;

wherein said transistor means exhibits an intrinsic transfer characteristic approximating a square law trasnfer characteristic and the combination of said transistor and said diode causes said mixer to exhibit an effective transfer characteristic approximating a square law transfer characteristic over a greater range of operating current than that exhibited by said transistor without said diode said square law transfer characteristic causing a reduction in amplitude, in said IF output, of spurious signals as compared with said difference signal.

7. A mixer as recited in claim 6 further including IF filter means having an input coupled to said collector electrode for selecting as said IF signal, said difference signal and providing at an output said IF output signal.

* * * * *